US006638874B2

United States Patent
Yi et al.

(10) Patent No.: US 6,638,874 B2
(45) Date of Patent: Oct. 28, 2003

(54) METHODS USED IN FABRICATING GATES IN INTEGRATED CIRCUIT DEVICE STRUCTURES

(75) Inventors: Sang In Yi, Sunnyvale, CA (US); Seowoo Nam, Sunnyvale, CA (US); Kenlin Huang, Fremont, CA (US); Padmapani C. Nallan, San Jose, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 10/198,298

(22) Filed: Jul. 17, 2002

(65) Prior Publication Data

US 2003/0186556 A1 Oct. 2, 2003

Related U.S. Application Data

(60) Provisional application No. 60/365,144, filed on Mar. 14, 2002.

(51) Int. Cl.[7] .............................................. H01L 21/302
(52) U.S. Cl. ...................... 438/720; 438/706; 438/714
(58) Field of Search ................................. 438/305, 706, 438/707, 710, 714, 720

(56) References Cited

U.S. PATENT DOCUMENTS 6,323,537 B1 * 11/2001 Fritzinger et al. .......... 257/532
6,358,859 B1 * 3/2002 Lo et al. .................... 438/712
6,380,008 B2 * 4/2002 Kwok et al. ................ 438/158
6,475,922 B1 * 11/2002 Zheng ........................ 438/725

OTHER PUBLICATIONS

R. Bersin, "Abstract: Plasma etching of thin metal and dielectric films" in *J.Vac Sci. Technol.*, vol. 13, No. 1, Jan./Feb. 1978, p. 169.
D. B. Fraser et al. "Tantalum silicide/polycrystalline silicon—High conductivity gates for CMOS LSI applications" in *J.Vac Sci. Technol.*, 18(2), Mar. 1981, pp. 345–348.
H. Cho et al. "Corrosion–free dry etch patterning of magnetic random access memory stacks: Effects of ultraviolet illumination" in *J. Appl. Phys.*, vol. 87, No. 9, May 1, 2000, pp. 6397–6399.
H. Shimada et al. "Tantalum Nitride Metal Gate FD–SOI CMOS FETs Using Low Resistivity Self–Grown bcc–Tantalum Layer" in *IEEE Trans. on Elec. Dev.*, vol. 48, No. 8, pp. 1619–1626, Aug., 2001.

* cited by examiner

*Primary Examiner*—Vu A. Le
*Assistant Examiner*—Brad Smith
(74) *Attorney, Agent, or Firm*—Michael B. Einschlag; Joseph Bach

(57) ABSTRACT

One embodiment of the present invention is a method used to fabricate a device on a substrate, which method is utilized at a stage of processing wherein a metal gate stack is disposed or formed over a gate oxide, which metal stack includes a refractory metal layer disposed or formed over a refractory metal barrier/adhesion layer, which method includes steps of: (a) etching the refractory metal layer and stopping on or in the refractory metal barrier/adhesion layer; and (b) etching the refractory metal barrier/adhesion layer using a passivation etching chemistry without oxygen.

21 Claims, 2 Drawing Sheets

METHODS USED IN FABRICATING GATES IN INTEGRATED CIRCUIT DEVICE STRUCTURES

This application claims the benefit of U.S. Provisional Application No. 60/365,144, filed on Mar. 14, 2002, which application is incorporated by reference herein.

Technical Field of the Invention

One or more embodiments of the present invention pertain to methods for use in fabricating gates and capacitors in integrated circuit ("IC") devices.

Background of the Invention

As pointed out in an article by H. Shimada et al. entitled "Tantalum Nitride Metal Gate FD-SOI CMOS FETs Using Low Resistivity Self-Grown bcc-Tantalum Layer" in *IEEE Transactions on Electron Devices*, Vol. 48, No. 8, pp. 1619–1626, August 2001 (the "Shimada article"), as complementary metal oxide semiconductor (CMOS) devices are scaled down aggressively to improve their performance, advanced gate technology has become a concern. For a polysilicon gate CMOS process, it is difficult to prevent a gate dopant (for example, boron) from penetrating through a thin gate oxide in ULSI technology. This results in instability in $V_{th}$ (voltage threshold), a degradation of gate oxide reliability, and a degradation of current drivability due to polysilicon gate depletion. Further, the sheet resistance of a gate electrode using silicide technology is high in scaled devices, and is not large enough to maintain a proper aspect ratio for a gate stack. Still further, scaled polysilicon gate devices require considerably higher channel doping to achieve acceptable $V_{th}$ values, resulting in lower channel mobility due to impurity scattering. In view of these limitations, the use of a refractory metal electrode is an attractive alternative. The article further discloses tantalum nitride ($TaN_x$) gate devices having a conventional planar gate structure to achieve low gate sheet resistance and low specific contact resistance.

Figure 1:
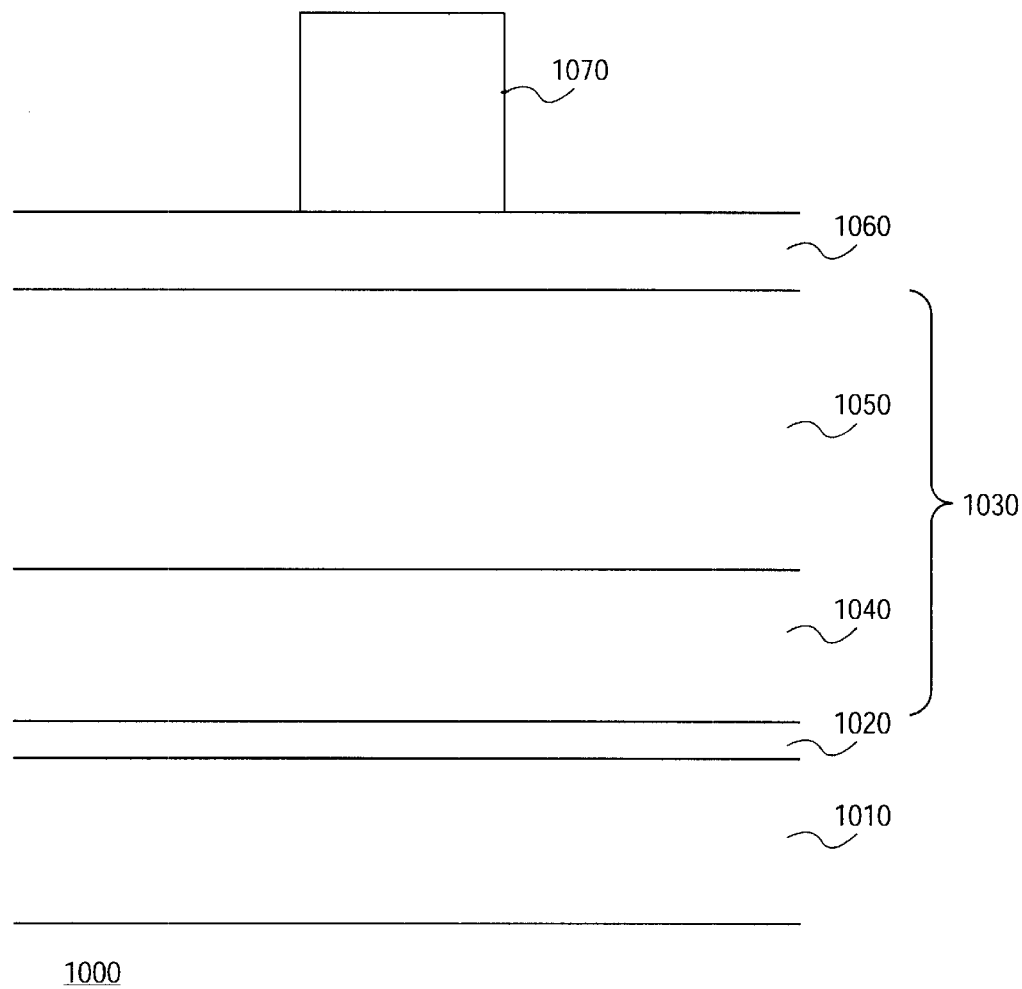

FIG. 1 shows a block diagram of a cross section of a wafer or substrate having devices being fabricated thereon (a work-in-progress), which work-in-progress includes a $TaN_x$/Ta/$TaN_x$ stacked metal gate structure. As shown in FIG. 1, structure 1000 includes: (a) wafer or substrate 1010 (for example, silicon wafer or substrate 1000); (b) gate oxide layer 1020 disposed or formed over wafer or substrate 1010; (c) metal gate stack 1030 that includes $TaN_x$ layer 1040 disposed or formed over gate oxide layer 1020, Ta layer 1050 disposed or formed over $TaN_x$ layer 1040, and $TaN_x$ layer 1060 disposed or formed over Ta layer 1050; and (d) patterned photoresist layer 1070 disposed or formed over $TaN_x$ layer 1060. $TaN_x$ layer 1060 is a protective capping layer used to protect metal gate stack 1030 from an oxidizing ambient such as might be present during source/drain annealing or ILD deposition. In addition, a $TaN_x$ layer is well known as serving as a barrier for copper diffusion. For one example, gate oxide layer 1020 has a thickness of about 3.8 nm; TaN layer 1040 has a thickness of about 40 nm; Ta layer 1050 has a thickness of about 120 nm; and $TaN_x$ layer 1060 has a thicknesses of about 40 nm.

Using the above-disclosed metal gate stack on a thin gate oxide to form an FET requires a selectivity of TaN/oxide of about 100 to 1. However, achieving such a high selectivity typically results in undercutting at an interface between the TaN layer and the gate oxide unless a passivation layer is also available at the metal gate stack sidewalls. The Shimada article discloses etching such a metal gate stack using an $SF_6$/$SiCl_4$ chemistry, however, such an etch chemistry does not provide suitable TaN/oxide selectivity, and will also produce undercutting.

SUMMARY OF THE INVENTION

One or more embodiments of the present invention advantageously solve one or more of the above-identified problems in the art. Specifically, one embodiment of the present invention is a method used to fabricate devices on a substrate, which method is utilized at a stage of processing wherein a metal gate stack is disposed or formed over a gate oxide, which metal stack includes a refractory metal layer disposed or formed over a refractory metal barrier/adhesion layer, which method comprises steps of: (a) etching the refractory metal layer and stopping on or in the refractory metal barrier/adhesion layer; and (b) etching the refractory metal barrier/adhesion layer using a passivation etching chemistry without oxygen.

BRIEF DESCRIPTION OF THE FIG.

Figure 2:
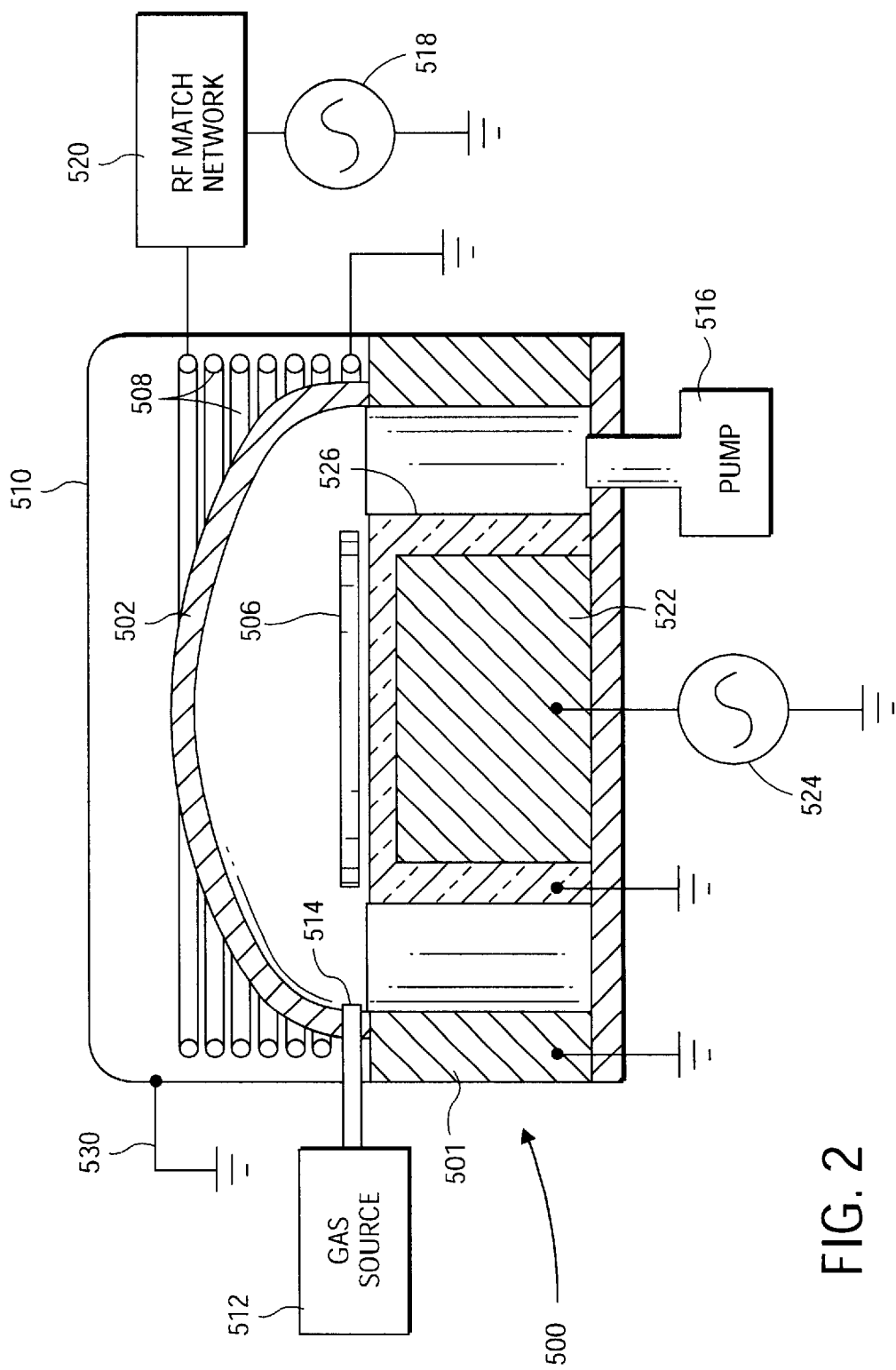

FIG. 1 shows a block diagram of a cross section of a wafer or substrate having devices being fabricated thereon (a work-in-progress), which work-in-progress includes a $TaN_x$/Ta/$TaN_x$ stacked metal gate structure; and FIG. 2 is a cross-section of an apparatus suitable for practicing one or more embodiments of the present invention.

DETAILED DESCRIPTION

The Shimada article discloses a $TaN_x$/Ta/$TaN_x$ stacked metal gate structure that is useful for forming FETs and capacitors. One or more embodiments of the present invention is a method for selectively etching the stacked metal gate structure.

FIG. 1 shows a block diagram of a cross section of a wafer or substrate having devices being fabricated thereon (a work-in-progress), which work-in-progress includes a $TaN_x$/Ta/$TaN_x$ stacked metal gate structure. As shown in FIG. 1, structure 1000 includes: (a) wafer or substrate 1010 (for example, silicon wafer or substrate 1000); (b) gate oxide layer 1020 disposed or formed over wafer or substrate 1010; (c) metal gate stack 1030 that includes $TaN_x$ layer 1040 disposed or formed over gate oxide layer 1020, Ta layer 1050 disposed or formed over $TaN_x$ layer 1040, and $TaN_x$ layer 1060 disposed or formed over Ta layer 1050; and (d) patterned photoresist layer 1070 disposed or formed over $TaN_x$ layer 1060. $TaN_x$ layer 1060 is an optional protective capping layer used to protect metal gate stack 1030 from an oxidizing ambient such as might be present during source/drain annealing or ILD deposition. A $TaN_x$ layer will also be referred to herein as a TaN layer. For one example, gate oxide layer 1020 has a thickness of about 3.0 nm; TaN layer 1040 has a thickness of about 40 nm; Ta layer 1050 has a thickness of about 120 nm; and $TaN_x$ layer 1060 has a thickness of about 40 nm. For metal gate stack 1030, TaN layer 1040 serves as a barrier/adhesion layer.

One or more embodiments of the present invention provide an etching process for use in etching metal gate stack 1030 that includes an overetch process which utilizes an HBr chemistry (in the absence of oxygen), and which overetch process takes place at a high enough wafer support temperature to enable HBr to etch TaN. In accordance with one or more embodiments of the present invention, a processing gas that includes HBr is utilized in a plasma chamber (for example, and without limitation, a high density plasma chamber) to perform the etch process.

Any one of a number of processing apparatus can be used to practice one or more embodiments of the present invention. For example, a Decoupled Plasma Source ("DPS") Polysilicon Etch Chamber apparatus available from Applied Materials, Inc. of Santa Clara, Calif. may be used to practice one or more embodiments of the present invention. FIG. 2 is a cross-section of an apparatus suitable for practicing one or more embodiments of the present invention. As shown in FIG. 2, an inductively-coupled, RF plasma etching apparatus includes processing chamber 500 that includes grounded, conductive, cylindrical sidewall 501, and dielectric ceiling 502. As further shown in FIG. 2, the etching apparatus includes wafer pedestal (or cathode) 526 that supports semiconductor wafer or substrate 506 substantially in the center of processing chamber 500. In accordance with one or more embodiments of the present invention, wafer pedestal 526 actively holds the substrate in place, for example, and without limitation, by including an electrostatic chuck mechanism that is well known to those of ordinary skill in the art. Processing chamber 500 further includes: (a) cylindrical inductor coil 508 that surrounds an upper portion of processing chamber 500 (beginning near a plane at the top of wafer pedestal 526 and extending upwardly therefrom toward top 510 of processing chamber 500); (b) processing gas source 512; (c) gas inlet 514 that furnishes a processing gas into the interior of processing chamber 500; and (d) pump 516 that controls the pressure in processing chamber 500.

Inductor coil 508 is energized by plasma source power supply (or RF generator) 518 (to apply power $W_s$) through RF match network 520, the top winding of inductor coil 508 being "hot" and the bottom winding being grounded. Wafer pedestal 526 includes an interior conductive portion 522 that is connected to RF bias power supply (or generator) 524 (to apply bias power $W_b$) and an exterior grounded conductor (insulated from interior conductive portion 522). Conductive, grounded, RF shield 530 surrounds inductor coil 508.

To etch metal gate stack 1030, substrate 506 is transferred into processing chamber 500, and placed on wafer pedestal 526. A process gas output from processing gas source 512 is introduced into processing chamber 500 through gas inlet 514 (in alternative embodiments, the processing gas may be input through a showerhead apparatus that is well known to those of ordinary skill in the art). A plasma is generated and maintained by applying power $W_s$ to inductor coil 508 from RF generator 518 through RF match network 520, and by applying power $W_b$ to interior conductive portion 522 of wafer pedestal 504 from RF bias power supply 524. Processing chamber 500 is maintained at a process pressure that is determined by the flow of the process gas into processing chamber 500, and the pumping rate of pump 516.

In accordance with one or more embodiments of the present invention, anodized aluminum sidewall 501 is heated to a temperature of about 80° C. to prevent deposition of condensable etchant by-product species on sidewall 501 in accordance with any one of a number of methods that are well known to those of ordinary skill in the art. Appropriate ranges of values of sidewall temperature may be determined routinely by one of ordinary skill in the art without undue experimentation. In addition, in accordance with one or more embodiments of the present invention, dielectric ceiling 502 is maintained at a temperature of about 80° C. to prevent polymer deposition thereon to reduce particles in the process zone in accordance with any one of a number of methods that are well known to those of ordinary skill in the art. Appropriate ranges of values of dielectric ceiling temperature may be determined routinely by one of ordinary skill in the art without undue experimentation. In accordance with one or more embodiments of the present invention, wafer pedestal 526 is heated, for example, and without limitation, by flowing fluid therethrough, to a temperature in a range from about 10° C. to about 120° C. in accordance with any one of a number of methods that are well known to those of ordinary skill in the art. The plasma formed from the process gas may heat substrate 506 to a temperature in a range of about 60° C. to about 250° C. Further, in accordance with one or more embodiments of the present invention, the temperature of substrate 506 is maintained at a substantially constant level by passing a cooling gas (for example, and without limitation, helium) over a backside of substrate 506 in accordance with any one of a number of methods that are well known to those of ordinary skill in the art. Helium may be flowed at pressure in a range from about 0 Torr to about 16 Torr. Appropriate ranges of values of backside cooling gas pressure may be determined routinely by one of ordinary skill in the art without undue experimentation.

In accordance with one or more embodiments of the present invention, an etch process for metal gate stack 1030 utilizes a "main" etch step and an "overetch" step. Process conditions for one or more such embodiments that utilize a 35 liter chamber (for example, a 200 mm DPS Polysilicon Etch chamber available from Applied Materials, Inc. of Santa Clara, Calif.) are as follows for the "main" etch step: a flow rate of $CF_4$ in a range from about 70 to about 120 sccm; a flow rate of $NF_3$ in a range from about 10 sccm to about 50 sccm; (optional) diluents including one or more Ar, $N_2$, and He (appropriate ranges of proportions of the precursor gases and the diluents may be determined routinely by one or ordinary skill in the art without undue experimentation); a chamber pressure in a range from about 2 mTorr to about 6 mTorr; an RF current applied to inductive coil 508 at a frequency, for example, and without limitation, of about 12.56 MHz and at a power level $W_s$ in a range from about 300 W to about 800 W; an RF bias current applied to wafer pedestal 526 at a frequency, for example, and without limitation, of about 13.56 MHz and at power level $W_b$ in a range from about 40 W to about 350 W; a temperature of wafer pedestal 526 maintained in a range from about 30° C. to about 90° C.; and a wafer support backside gas pressure (He) in a range from about 2 to about 12 Torr. In accordance with at least some of such embodiments, a ratio of flow rates for $CF_4/NF_3$ is in a range from about 1.5:1 to about 8:1. In accordance with one or more embodiments of the present invention, the main etch step may be ended utilizing an endpoint detector that focuses on an emission at one or more of the following wavelengths: 2880 Å, 3850 Å, and 5160 Å in accordance with any one of a number of methods that are well known to those of ordinary skill in the art. The endpoint may be detected by an increase in the peak intensity of such emissions at the Ta/TaN interface. In addition, the endpoint may be detected by a change in slope of the emission signal intensity at the Ta/TaN interface. In accordance with one specific embodiment of the present invention, the process conditions are: a flow rate of $CF_4$ of about 120 sccm, a flow rate of $NF_3$ of about 30 sccm, $W_s$ of about 600 Watts, $W_b$ of about 200 Watts, chamber pressure of about 3 mTorr, backside He pressure of about 8 Torr, and wafer pedestal temperature of about 80° C.

In accordance with one or more embodiments of the present invention, the overetch step utilizes a passivation etch chemistry. Process conditions for one such embodiment are as follows for the overetch step: a flow rate of HBr in a range from about 190 to about 210 sccm; (optional) diluents including one or more Ar, $N_2$, and He (appropriate ranges of proportions of the precursor gases and the diluents may be determined routinely by one or ordinary skill in the art without undue experimentation); a chamber pressure in a range from about 20 mTorr to about 40 mTorr; an RF current applied to inductive coil 508 at a frequency, for example, and without limitation, of about 12.56 MHz and at a power level $W_s$ in a range from about 1000 W to about 1500 W; substantially no power applied to the wafer pedestal; a temperature of wafer pedestal 526 maintained in a range from about 70° C. to about 120° C.; and a wafer support backside gas pressure (He) in a range from about 0 to about 4 Torr.

In accordance with the above-described embodiment, the main etch step provides a vertical profile, and the overetch step clears TaN having a thickness, for example, in a range from about 300 to about 400 Å, along with any remaining residue. It is important to note that no oxygen is utilized in the overetch step because, if oxygen were used, an etch-stop will occur for both TaN and Ta.

Process conditions for one or more alternative embodiments of the present invention are as follows for the overetch step: a flow rate of HBr in a range from about 20 to about 400 sccm; a flow rate of $Cl_2$ in a range from about 0 to about 50 sccm; a flow ratio for $Cl_2$/HBr of<about 2.0; (optional) diluents including one or more Ar, $N_2$, and He (appropriate ranges of proportions of the precursor gases and the diluents may be determined routinely by one or ordinary skill in the art without undue experimentation); a chamber pressure in a range from about 10 mTorr to about 100 mTorr; an RF current applied to inductive coil 508 at a frequency, for example, and without limitation, of about 12.56 MHz and at a power level $W_s$ in a range from about 300 W to about 1500 W; an RF bias current applied to wafer pedestal 526 at a frequency, for example, and without limitation, of about 13.56 MHz and at power level $W_b$ in a range from about 0 W to about 40 W; a temperature of wafer pedestal 526 maintained in a range from about 50° C. to about 120° C.; and a wafer support backside gas pressure (He) in a range from about 0 to about 4 Torr.

In accordance with one or more further embodiments of the present invention, the above-described overetch step can be divided into two steps, wherein the first step is a so-called "softlanding" overetch step. The softlanding overetch step has an increased etch rate when compared to the second overetch step, while having reasonable selectivity to the oxide. The second overetch step has an optimal selectivity to the oxide, but a lower etch rate than that provided by the softlanding overetch step. Process conditions for the softlanding overetch step are as follows: a flow rate of HBr in a range from about 20 to about 400 sccm; (optional) diluents including one or more Ar, $N_2$, and He (appropriate ranges of proportions of the precursor gases and the diluents may be determined routinely by one or ordinary skill in the art without undue experimentation); a chamber pressure in a range from about 10 mTorr to about 100 mTorr; an RF current applied to inductive coil 508 at a frequency, for example, and without limitation, of about 12.56 MHz and at a power level $W_s$ in a range from about 300 W to about 1500 W; an RF bias current applied to wafer pedestal 526 at a frequency, for example, and without limitation, of about 13.56 MHz and at power level $W_b$ in a range from about 30 W to about 100 W; a temperature of wafer pedestal 526 maintained in a range from about 50° C. to about 120° C.; and a wafer support backside gas pressure (He) in a range from about 0 to about 2 Torr. For one specific embodiment of the present invention, the process conditions are: a flow rate of HBr of about 200 sccm, $W_s$ of about 1000 Watts, $W_b$ of about 40 Watts, chamber pressure of about 30 mTorr, no backside He flow, and wafer pedestal temperature of about 80° C.

Further, process conditions for the second overetch step are substantially the same as the above, except that $W_b$ is less than about 20 Watts. For one specific embodiment, the process conditions are: a flow rate of HBr of about 200 sccm, $W_s$ of about 1200 Watts, $W_b$ of about 10 Watts, chamber pressure ~30 mTorr, no backside He flow, and wafer pedestal temperature of about 80° C. Still further, in accordance with one or more embodiments of the present invention, the softlanding overetch step may be performed for a fraction of the time used to perform the second overetch process, for example, a time ratio of less than about 10%–20%.

In accordance with one or more embodiments of the present invention, the overetch step utilizes no oxygen, and no fluorine based chemicals (to provide selectivity to the gate oxide) such as, for example, and without limitation, no $NF_3$, $CF_4$, $CH_2F_2$, $CH_3F$, $CHF_3$, and $SF_6$.

Further alternative embodiments of the present invention can readily be fabricated by those of ordinary skill in the art routinely and without undue experimentation in light of the teachings of the specification. In particular, the following teachings are noted for the overetch step. As the pressure in the chamber increases, $W_b$ can increase since the density of ions decreases. For example, it is observed that for a pressure of 60 mTorr in the chamber, $W_b$ can be as large as 40 W. However, it is also noted that etch uniformity (over a wafer) tends to decrease at such higher pressures, even as $W_b$ is increased. High pressure (for example, pressure in a range from about 40 to about 100 mTorr) and high $W_b$ (for example, $W_b$ in a range from about 20 to about 100 W) may be less favorable than an overetch step recipe for lower pressure (for example, pressure in a range from about 10 to about 40 mTorr) and low $W_b$ (for example, $W_b$ in a range from about 0 to about 20 W). However, given a sufficiently high wafer support temperature, a high pressure, high $W_b$ recipe is expected to provide acceptable results.

A wide range of $W_s$ can be used, however, a higher range of values of $W_s$, for example, 1000 W or higher, may be preferred since the etch rate is expected to be higher due to increased ion density and increased effective wafer surface temperature due to ion bombardment. In addition, the addition of inert gases in the overetch recipe is expected to improve the etch uniformity as the total gas flow increases.

Advantageously, in accordance with one or more embodiments of the present invention, the vertical profile provided by the main etch step for the TaN layer is maintained for the TaN layer despite the large overetch step usage, because HBr provides chemical passivation along the sidewalls of the metal gate stack structure.

For a 300 mm chamber, for the above-described embodiments, the flow rates may be scaled to be a factor of about 2 larger than for the 200 mm chamber; the source power may be scaled to be about a factor of 1 larger than for the 200 mm chamber; and the bias power may be scaled to be about a factor of about 1.5–2 larger than for the 200 mm chamber.

Although embodiments of the present invention were described utilizing a $TaN_x$ /Ta/$TaN_x$ stacked metal gate structure, the present invention is not limited to such embodiments. In fact further embodiments of the present invention are applicable to refractory metal gate structures such as, for example, and without limitation, a refractory metal, a (refractory metal)/(refractory metal adhesion/barrier layer) structure, and a (refractory metal cap layer)/(refractory metal)/(refractory metal adhesion/barrier layer) structure. In particular, examples of such refractory metal gate structures include, without limitation, $Ta/TaN_x$, $W/WN_x$, $TaN_x$ /$Ta/TaN_x$, and $WN_x/W/WN_x$ gate structures.

Those skilled in the art will recognize that the foregoing description has been presented for the sake of illustration and description only. As such, it is not intended to be exhaustive or to limit the invention to the precise form disclosed. For example, although certain dimensions were discussed above, they are merely illustrative since various designs may be fabricated using the embodiments described above, and the actual dimensions for such designs will be determined in accordance with circuit requirements.

What is claimed is:

1. A method used to fabricate a device on a substrate, which method is utilized at a stage of processing wherein a metal gate stack is disposed or formed over a gate oxide, which metal stack includes a refractory metal layer disposed or formed over a refractory metal barrier/adhesion layer, which method comprises steps of:
   etching the refractory metal layer and stopping on or in the refractory metal barrier/adhesion layer; and
   etching the refractory metal barrier/adhesion layer using a passivation etching chemistry without oxygen, which passivation etching chemistry is selective to the gate oxide.

2. The method of claim 1 wherein the step of etching the refractory metal layer utilizes a main etch chemistry that includes $CF_4$.

3. The method of claim 2 wherein the step of etching the refractory metal takes place in a plasma chamber.

4. The method of claim 3 wherein the plasma chamber is a high density plasma chamber.

5. The method of claim 1 wherein etching the refractory metal barrier/adhesion layer using a passivation etching chemistry without oxygen utilizes an overetch chemistry that includes HBr.

6. The method of claim 5 wherein the overetch chemistry further comprises $Cl_2$ and utilizes a flow rate of HBr in a range from about 20 to about 400 sccm; and a flow rate of $Cl_2$ in a range from about 0 to about 50 sccm.

7. The method of claim 5 wherein the overetch chemistry further comprises $Cl_2$ and utilizes a flow ratio for $Cl_2$/HBr of<about 2.0.

8. The method of claim 5 wherein the overetch chemistry further includes $Cl_2$.

9. The method of claim 5 wherein the substrate is placed on a wafer pedestal that is maintained at a temperature high enough during the step of etching the refractory metal barrier/adhesion layer to enable the overetch chemistry that includes HBr to etch the refractory metal barrier/adhesion layer.

10. The method of claim 9 wherein the temperature of the wafer pedestal is maintained in a range from about 50° C. to about 120° C.; and wherein a gas is applied to a backside of the wafer pedestal at a pressure that is maintained in a range from about 0 to about 4 Torr.

11. The method of claim 5 wherein the overetch process takes place in a plasma chamber.

12. The method of claim 11 wherein the plasma chamber is a high density plasma chamber.

13. The method of claim 5 wherein the refractory metal layer is a Ta layer, and the refractory metal barrier/adhesion layer is a $TaN_x$ layer.

14. The method of claim 1 wherein the refractory metal layer is a Ta layer, and the refractory metal barrier/adhesion layer is a $TaN_x$ layer, and wherein an endpoint for the step of etching the refractory metal is determined utilizing an endpoint detector that utilizes an emission at one or more of the following wavelengths: 2880 Å, 3850 Å, and 5160 Å.

15. The method of claim 14 wherein the endpoint may be detected by an increase in a peak intensity of the emission at a $Ta/TaN_x$ interface, or by a change in slope of an emission signal intensity at the $Ta/TaN_x$ interface.

16. The method of claim 1 wherein etching the refractory metal barrier/adhesion layer utilizes an overetch step that comprises a softlanding overetch step and a second overetch step, wherein the softlanding overetch step has an increased etch rate when compared to the second overetch step, and wherein the second overetch step has a better selectivity to the gate oxide when compared to the softlanding overetch step.

17. The method of claim 16 wherein the overetch step utilizes no fluorine based chemicals.

18. A method used to fabricate a device on a substrate, which method is utilized at a stage of processing wherein a metal gate stack is disposed or formed over a gate oxide, which metal stack includes a refractory metal layer disposed or formed over a refractory metal barrier/adhesion layer, which method comprises steps of:
   etching the refractory metal layer and stopping on or in the refractory metal barrier/adhesion layer; and
   etching the refractory metal barrier/adhesion layer using a passivation etching chemistry without oxygen,
   wherein the step of etching the refractory metal layer utilizes a main etch chemistry that includes $CF_4$: and
   wherein the main etch chemistry further includes $NF_3$.

19. The method of claim 18 wherein the main etch chemistry utilizes a flow rate of $CF_4$ in a range from about 70 to about 120 sccm; and a flow rate of $NF_3$ in a range from about 10 sccm to about 50 sccm.

20. The method of claim 18 wherein the main etch chemistry utilizes a ratio of flow rates for $CF_4/NF_3$ in a range from about 1.5:1 to about 8:1.

21. A method used to fabricate a device on a substrate, which method is utilized at a stage of processing wherein a metal gate stack is disposed or formed over a gate oxide, which metal stack includes a refractory metal layer disposed or formed over a refractory metal barrier/adhesion layer, which method comprises steps of:
   etching the refractory metal layer and stopping on or in the refractory metal barrier/adhesion layer; and
   etching the refractory metal barrier/adhesion layer using a passivation etching chemistry without oxygen;
   wherein etching the refractory metal barrier/adhesion layer using a passivation etching chemistry without oxygen utilizes an overetch chemistry that includes HBr, and
   wherein the refractory metal layer is a Ta layer, and the refractory metal barrier/adhesion layer is a $TaN_x$ layer.

* * * * *